United States Patent [19]

Takeda et al.

[11] Patent Number: 6,021,072
[45] Date of Patent: Feb. 1, 2000

[54] METHOD AND APPARATUS FOR PRECHARGING BITLINES IN A NONVOLATILE MEMORY

[75] Inventors: Fujio Takeda; Steve Vu, both of Austin, Tex.

[73] Assignee: Motorola, Inc., Schaumburg, Ill.

[21] Appl. No.: 09/123,927

[22] Filed: Jul. 27, 1998

[51] Int. Cl.[7] .................................................. G11C 7/00
[52] U.S. Cl. .............................. 365/189.11; 365/185.25; 365/203
[58] Field of Search .............................. 365/203, 185.25, 365/204, 189.11, 94, 103

[56] References Cited

U.S. PATENT DOCUMENTS

| | | | |
|---|---|---|---|
| 4,809,230 | 2/1989 | Konishi et al. | 365/203 |
| 5,249,153 | 9/1993 | Conan | 365/185.25 |
| 5,671,186 | 9/1997 | Igura | 365/185.25 |
| 5,748,536 | 5/1998 | Kwon et al. | 365/185.25 |
| 5,864,511 | 1/1999 | Sato . | |

*Primary Examiner*—Tan T. Nguyen
*Attorney, Agent, or Firm*—Joanna P. Gariazzo

[57] ABSTRACT

A method for precharging a selected bitline (20) in a nonvolatile memory array using a boost circuit (54) in parallel to a pull-up device (22) for biasing the bitline. The boost circuit (54) is controlled by a pulse signal (26). One embodiment uses a regulator circuit (56) to isolate the boost circuit (54) from the bitline when the bitline voltage exceeds a threshold voltage level. The regulator triggers a delay circuit (58) which is coupled to a sense amplifier (60). The delay circuit (58) then defers activation of the sense amplifier (60) until the voltage on the selected bitline (20) is below a sense amplifier threshold voltage level.

20 Claims, 3 Drawing Sheets

METHOD AND APPARATUS FOR PRECHARGING BITLINES IN A NONVOLATILE MEMORY

FIELD OF THE INVENTION

The present invention is directed to nonvolatile memories, and more particularly, to a circuit for precharging bitlines.

BACKGROUND OF THE INVENTION

A read only memory (ROM) is a nonvolatile memory that is programmed at process time with a binary 1 or 0. FIG. 1 illustrates one design of a ROM as typically used today. In this ROM, the bitline precharge control 4 controls the precharging of the bitlines, and the existence of a plug transistor 11 indicates that the bitcell is programmed with a 0. Likewise, the lack of a plug transistor indicates that the bitcell is programmed with a 1. Multiplexer 2 electrically couples the accessed bitline with selected bitline 5, which is inputted to the sense amplifier to produce the ROM output. When a bitcell is accessed through multiplexer 2, all of the bitlines having a plug along the selected wordline 3 are discharged whether or not these particular bitcells were being accessed. Therefore, before a new bitcell is accessed, each bitline that was discharged must once again be precharged by bitline precharge control 4. This scheme is not power efficient since all of the bitlines containing plugs along the accessed wordline are precharged and discharged each time a bitcell is accessed. Therefore, a different scheme such as illustrated in FIG. 2 has also been implemented to address the power inefficiencies of the scheme of FIG. 1.

FIG. 2 illustrates a traditional ROM using a small (weak) pull-up device 18. In operation, the small pull-up device 18 pulls up the selected bitline 10, yet it is much weaker as compared to plug transistor 11 so that plug transistor 11 can overcome device 18 and pull down selected bitline 10. As memory arrays increase in size, though, the bitlines become more heavily loaded, thus the pull-up time of pull-up device 18 increases. That is, the time required for the pull-up device 18 to pull up selected bitline 10 increases. Therefore, as ROM sizes continue to increase, a need exists for a memory scheme that is both power efficient and has a faster pull-up time.

DETAILED DESCRIPTION

The present invention allows for a method for precharging a selected bitline in a nonvolatile memory array using a boost circuit in parallel to a pull-up device for biasing a bitline. The boost circuit, also referred to as a pulse operated precharge circuit, is controlled by a pulse signal. One embodiment uses a regulator circuit to isolate or decouple the boost circuit from the bitline when the bitline voltage exceeds a threshold voltage level (the regulation voltage). The regulator triggers a delay circuit which is coupled to a sense amplifier. The delay circuit then defers activation of the sense amplifier until the voltage on the selected bitline is below a sense amplifier threshold voltage level.

One embodiment of the present invention includes a memory device comprising a memory array having a plurality of memory cells with a pull-up device coupled to a selected bitline of the memory array. The memory device also includes a boost unit coupled to the selected bitline and parallel to the pull-up device. The boost unit is adapted to bias the selected bitline prior to the selection of a wordline.

Another embodiment allows for a method for reading a nonvolatile memory cell in a memory array. The method includes selecting a bitline corresponding to the nonvolatile memory cell and biasing the bitline with a first circuit and a second circuit. The second circuit is enabled by assertion of a pulse signal where negating the pulse signal disables the second circuit. A wordline corresponding to the nonvolatile memory is selected, and a sense amplifier is enabled to read the bitline.

Figure 3:
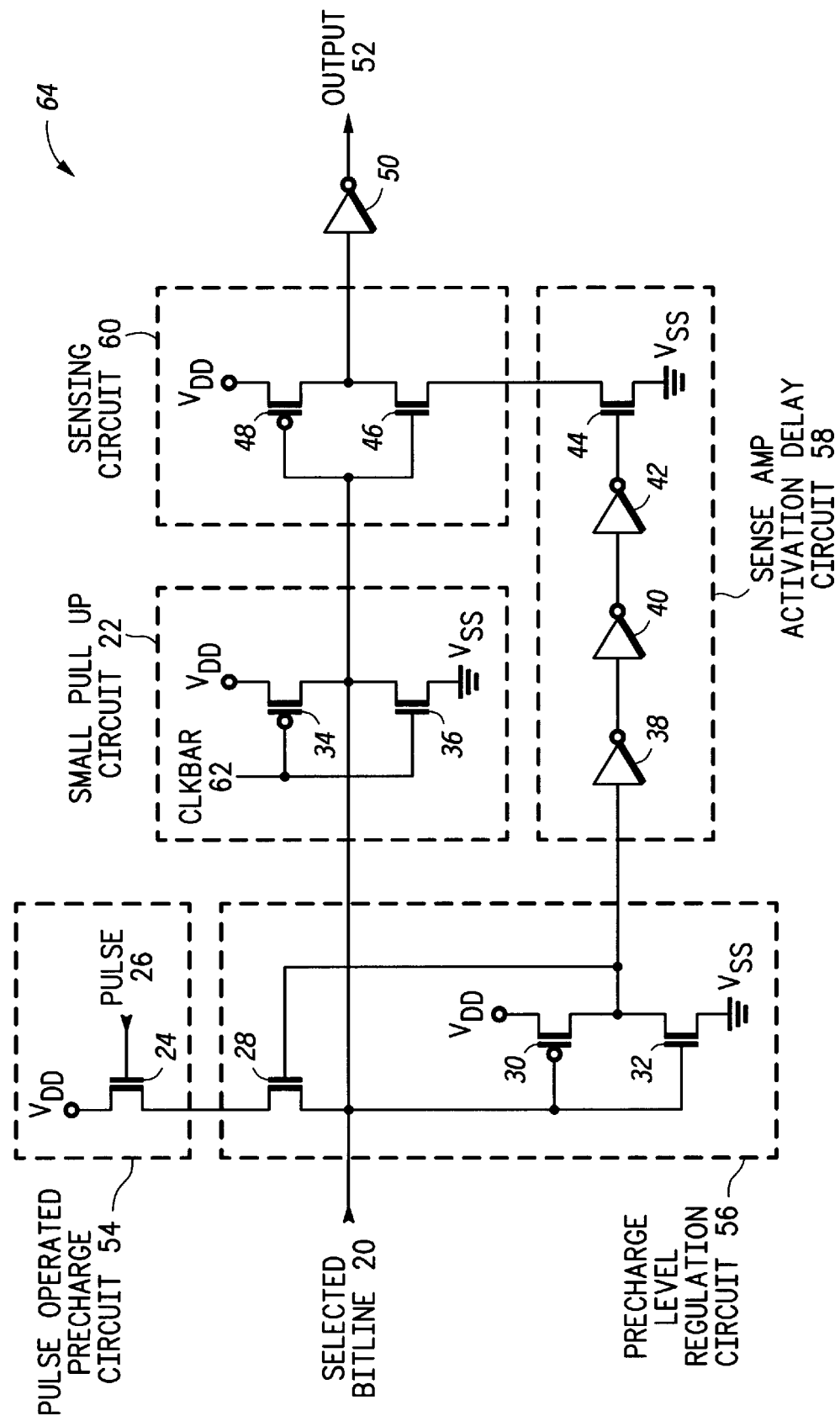
FIG. 3 illustrates a block diagram of a ROM sensing scheme in accordance with one embodiment of the present invention.

In one embodiment of the present invention, illustrated in FIG. 3, ROM sensing scheme 64 includes a pulse operated precharge circuit 54 coupled to precharge level regulation circuit 56. Small pull-up circuit 22 is coupled to precharge level regulation circuit 56 and sensing circuit 60. Sense amplifier activation delay circuit 58 is coupled to both precharge level regulation circuit 56 and sensing circuit 60. Pulse operated precharge circuit 54 includes n-channel device 24. Precharge level regulation circuit 56 includes n-channel device 28, p-channel device 30, and n-channel device 32, where p-channel device 30 and n-channel device 32 form an inverter. Small pull-up circuit 22 includes p-channel device 34 and n-channel device 36. Sense amplifier activation delay circuit 58 includes inverters 38, 40, 42, coupled in series with n-channel device 44. Sensing circuit 60 includes p-channel device 48 and n-channel device 46.

The first terminal of n-channel device 24 is coupled to VDD and the second terminal of n-channel device 24 is coupled to the first terminal of n-channel device 28. The second terminal of n-channel device 28 is coupled to selected bitline 20, the gate of p-channel device 30, and the gate of n-channel device 32. An input pulse is provided to the pulse input 26, which is coupled to the gate of n-channel device 24. The gate of n-channel device 28 is coupled to the second terminal of p-channel device 30 and the first terminal of n-channel device 32. The first terminal of p-channel device 30 is coupled to VDD and the second terminal of n-channel device 32 is coupled to VSS. The gate of n-channel device 28 is also coupled to the input of inverter 38. The output of inverter 38 is coupled to the input of inverter 40, and the output of inverter 40 is coupled to the input of inverter 42. The output of inverter 42 is coupled to the gate of n-channel device 44. The second terminal of n-channel 44 is coupled to VSS and the first terminal of n-channel device 44 is coupled to the second terminal of n-channel device 46. The gate of n-channel device 46 is coupled to the gate of p-channel device 48, the second terminal of p-channel device 34, the first terminal of n-channel device 36, and selected bitline 20. The first terminal of p-channel device 34 is coupled to VDD and the second terminal of n-channel device 36 is coupled to VSS. The clock signal (CLKBAR) 62 is coupled to the gates of p-channel device 34 and n-channel device 36. The first terminal of p-channel device 48 is coupled to VDD, and the second terminal of p-channel device 48 is coupled to the first terminal of n-channel device 46 and the input of inverter 50. The output of inverter 50 is coupled to output 52. Generally, VDD is higher than VSS. For example, in one embodiment of the present invention, VSS is equal to 0 volts, and VDD is equal to 2.7 volts. Alternatively, they can be set at different values as required by the circuit's design.

Figure 1:
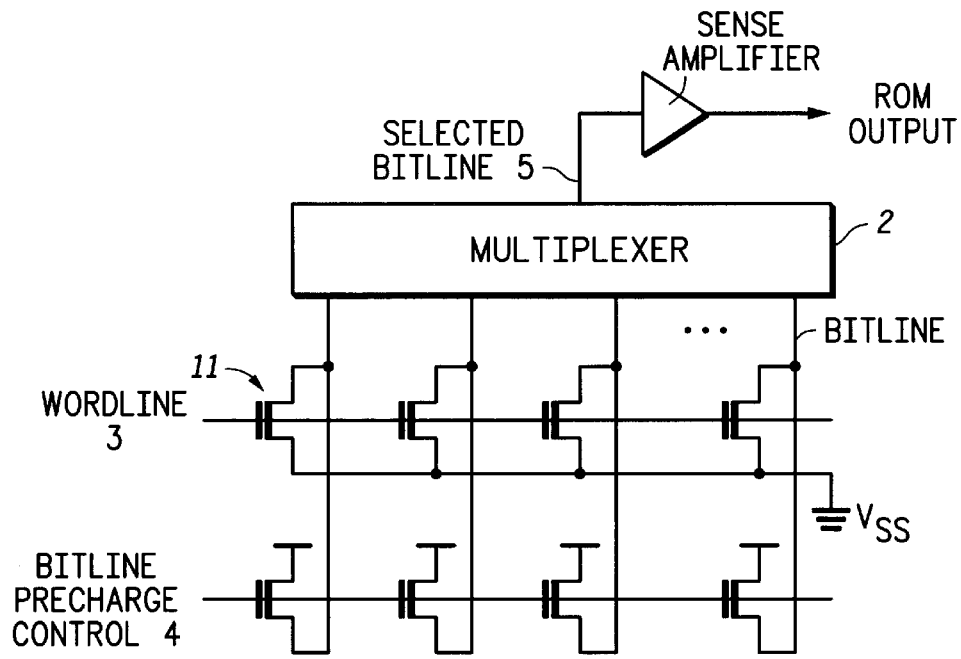
FIG. 1 illustrates in schematic form one design of a typical ROM.
Figure 2:
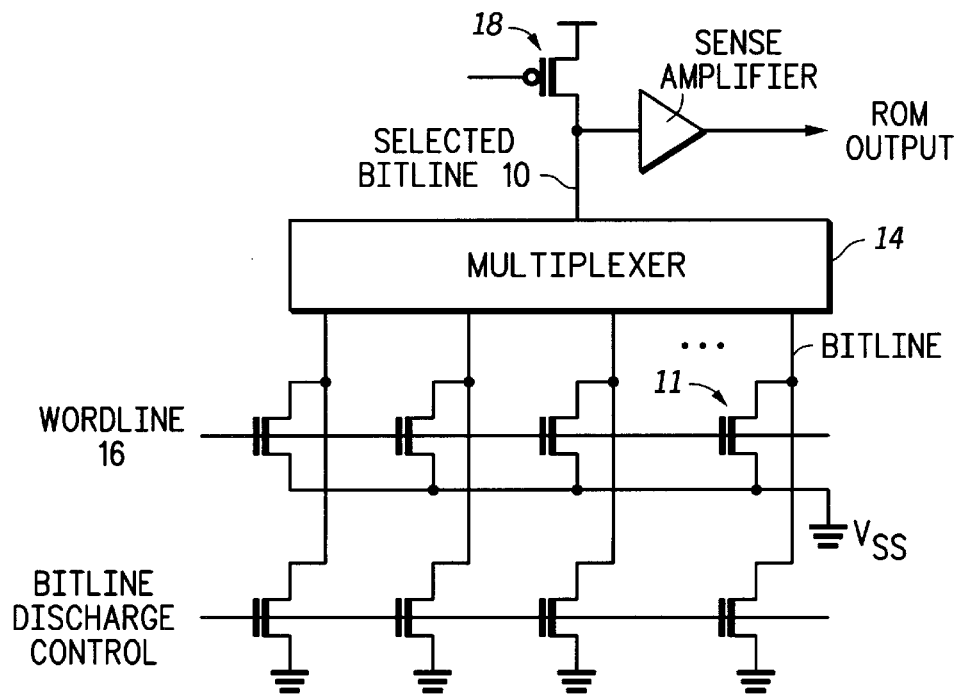
FIG. 2 illustrates another design of a typical prior art ROM using a small pull-up device.

In operation, FIG. 3 illustrates a ROM sensing scheme 64 in accordance with one embodiment of the present invention. The selected bitline 20 is the output of a column multiplexer (for example, multiplexer 14 of FIG. 2) of a ROM device. In one embodiment of the present invention, a ROM (or other nonvolatile memory) similar to that of FIG. 2 can be used where each bitline has an associated bitline discharge device. In this ROM design, the existence of a plug transistor, such as plug transistor 11, indicates a data of 0 programmed at that bit location and therefore acts to pull the bitline low when accessed. On the other hand, the absence of a plug transistor indicates a data of 1 programmed at that bit location and allows the weak pull-up device 34 to pull the bitline high when accessed (since there is no plug to pull the bitline low).

Since every bitline has an associated discharge device, operation of the circuit begins with selected bitline 20 at a discharge state, where, in one embodiment of the present invention, the discharge state refers to VSS. When the ROM is accessed, the accessed bitline is electrically coupled to the selected bitline 20 through a multiplexer such as multiplexer 14. The pulse operated precharge circuit 54, also known as a boost unit, then quickly pulls up the selected bitline 20, as will be further described in reference to FIG. 4. This is accomplished by applying a pulse 26 to the gate of n-channel device 24. N-channel device 24 is a strong device with a high current drive capability as compared to the plug transistor of the selected bitcell as well as to the pull-up device 34 which functions similarly to the pull-up device 18 of FIG. 2. This stronger n-channel device 24 allows for a rapid pull-up of selected bitline 20.

Precharge level regulation circuit 56 decouples the pulse signal 26 once the selected bitline 20 exceeds the threshold of the inverter (p-channel device 30 and n-channel device 32), also known as the regulation voltage. In one embodiment of the present invention, the threshold of the inverter is designed to be slightly higher than the threshold of n-channel device 32. When the output of the inverter, which is coupled to the gate of n-channel transistor 28, is 0, the n-channel transistor 28 is turned off, thus disconnecting n-channel device 24 from the circuit, thereby decoupling or isolating pulse 26 from the rest of ROM sensing scheme 64. The decoupling does not occur instantaneously, though, since there is some circuit delay time associated with the inverter between reaching the regulation voltage and actually turning off the transistor 28. Alternatively, other level regulation circuits can be designed to quickly rspond to selected bitline 20 and decouple the input pulse 26, as performed by precharge level regulation circuit 56.

Once the pulse 26 is decoupled from the circuit, only the weaker p-channel device 34 is left pulling up on selected bitline 20. P-channel device 34 is a weak pull-up device which is substantially smaller and weaker than n-channel device 24. P-channel device 34 is also substantially weaker than the plug transistor 11 of the selected bitcell. The weak pull-up device 34 is necessary so that the plug transistor 11 of the selected bitcell can pull down selected bitline 20 (assuming that bitcell is programmed with a 0). N-channel device 36 is an initialization device which assures that the selected bitline 20 at the output of the multiplexer is initialized to a known voltage. In one embodiment of the present invention, n-channel device 36 initializes selected bitline 20 to VSS.

Figure 4:
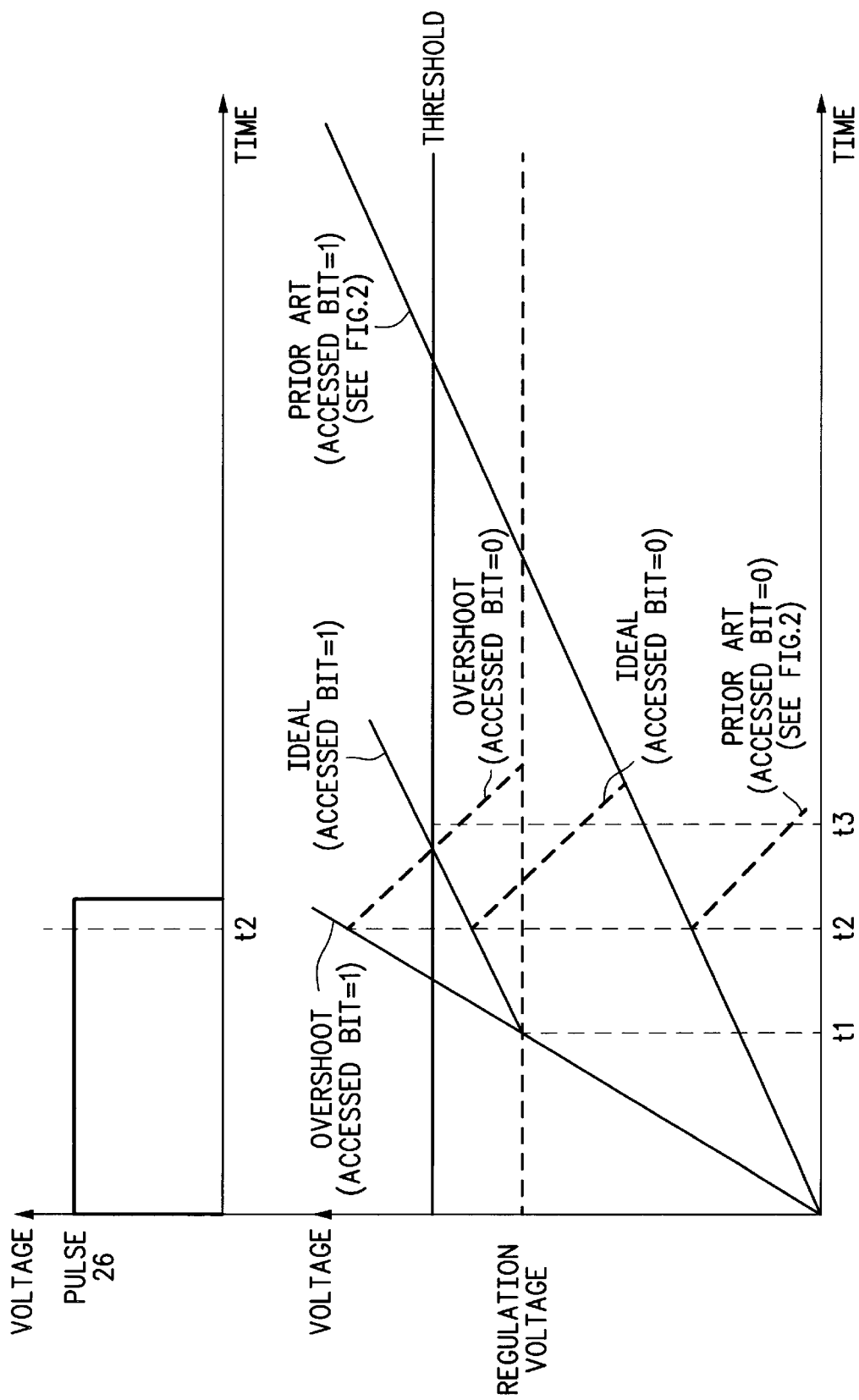
FIG. 4 is a timing diagram of the selected bitline and pulse input of the ROM sensing scheme of FIG. 3.

The sense amplifier activation delay circuit 58 and sensing circuit 60 will be further described in reference to FIG. 4. The string of inverters 38, 40, 42, are used to delay activation of the sense amplifier circuit 60. Once the signal from the output of the precharge level regulation circuit 56 reaches the output of the inverter 42, n-channel transistor 44 enables sensing circuit 60. Therefore, alternate embodiments may include a variety of different delay circuitry designs.

The sensing circuit 60, once enabled, determines whether the selected bitline 20 is above or below a predetermined threshold. If above the threshold, the output 52 becomes a logic high (or logic 1), and if below the threshold, the output 52 becomes a logic low (or logic 0). Therefore, the output of the sensing circuit 60 and likewise, output 52, is now a digital signal (either a logic 1 or 0).

FIG. 4 illustrates the voltage levels of selected bitline 20 and input pulse 26. Pulse 26 is the pulse applied to the gate of n-channel device 24 of the pulse operated precharge circuit 54. The width of this pulse is difficult to control due to process, temperature, and voltage variations; therefore, the precharged level regulation circuit 56 allows for leeway in the width of the pulse 26.

Since n-channel device 24 is a strong pull-up device, selected bitline 20 is rapidly pulled up as illustrated by the timing diagram before time $t_1$. Note that the rate of the pull-up of select bitline 20 is much greater than that of the prior art also shown in FIG. 4. At time $t_1$, which corresponds to the time that selected bitline 20 reaches the regulation voltage (which is generally below the threshold voltage), the precharge level regulation circuit 56 decouples pulse 26 from the sensing circuit, as described above. Due to the delay in the regulation circuit 56, the pulse 26 is not actually decoupled until some time later. Ideally, at time $t_1$, the pulse should be instantaneously decoupled, and selected bitline 20 would continue to be slowly pulled up by p-channel transistor 34 and no longer rapidly pulled up by n-channel device 24. This is illustrated by the gentler slope of the "ideal" selected bitline 20 voltage beginning at time $t_1$, as compared to the slope before $t_1$. The gentler slope beginning at time $t_1$ resembles the slope of the prior art pull-up rate. Thus, selected bitline 20 is able to reach the threshold voltage in a shorter time than the prior art methods. Once again, the threshold voltage determines at which voltage level the output 52 becomes a logic 1 or logic 0.

The precharge level regulation circuit 56, does not instantaneously decouple pulse 26 due to the delay in the regulation circuitry. Therefore, the pulse is not actually decoupled until some time later. In one embodiment of the present, pulse 26 is not actually decoupled until time $t_2$, thereby causing selected bitline 20 to overshoot the threshold. Alternatively, pulse 26 may be decoupled sooner after time $t_1$, depending on the design of precharge level regulation circuit 56.

At time $t_2$, the selected wordline is activated. If the accessed bit is a 1, then an overshoot does not cause a problem since selected bitline 20 is going to continuously be pulled up by p-channel device 34 due to the absence of a plug transistor. However, if the accessed bit is a 0, the plug transistor of the bitcell is turned on. The plug then begins to bring down selected bitline 20 as illustrated in FIG. 4 with the lines labeled "accessed bit=0". Also, at any point after $t_1$, but before $t_3$, the pulse 26 can be turned off, thus allowing variations in the pulse width of pulse 26.

For example, in one embodiment of the present invention, as illustrated in FIG. 4, the falling edge of pulse 26 can occur at some time after $t_2$ since pulse 26 is decoupled from the circuit by this time. Alternatively, if pulse 26 is turned off at $t_1$, precharge level regulation circuit 56 would not be necessary because there would be no need to decouple pulse 26 from the circuit since pulse 26 would already be off. Therefore, if pulse 26 is designed to be turned off before the selected wordline is activated, pulse 26 could remain coupled to the circuit. Therefore, precharge level regulation circuit 56 allows for some leeway in designing the falling edge of pulse 26 by decoupling pulse 26 in case it has not yet been turned off.

While the falling edge of pulse 26 does not have to occur at any specified time after $t_1$, it must at least occur before $t_3$, because once selected bitline 20 is pulled down below the regulation voltage by the plug transistor 11, n-channel device 24 is once again coupled to the circuit. If this occurs, and pulse 26 is still on, the plug 11 will not be able to pull down selected bitline 20 far enough from the sense amplifier threshold because, as mentioned above, n-channel device 24 is a stronger device than plug transistor 11. Therefore, as long as pulse 26 is off by time $t_3$, plug 11 can still pull down selected bitline 20 even if n-channel device 24 is once again coupled to the circuit.

For those cases where selected bitline 20 overshoots, the sense amplifier activation delay circuitry delays the activation of the sensing circuit 60 until a time $t_3$. This ensures that the output of sense circuit 60 has no glitches due to the overshoot of the selected bitline 20. For example, if the sense amplifier were activated immediately after $t_2$ without the delay, the output of the sense amplifier would momentarily be false (detecting a logic 1 since selected bitline 20 is above the threshold), thus causing a possible incorrect reading. Therefore, as long as the sense amplifier is enabled once the voltage on selected bitline 20 falls below the threshold voltage (such as at time $t_3$), the output 52 will be correct. Alternatively, the sense amplifier activation delay circuit 58 can be left out if such a possibility is tolerable.

Furthermore, if the width of pulse 26 is designed to precisely end at time $t_1$, an overshoot would not occur and the sense amplifier activation delay would not be needed since a false output would not occur. Also, if the pulse width is precisely designed, the precharge level regulation circuit 56 would not be necessary to decouple pulse 26 since the falling edge would accurately fall at time $t_1$. However, it is difficult to precisely design the pulse width of pulse 26 to be consistently accurate due to process and voltage variations. Alternate embodiments, though, may not include a precharge level regulation circuit or a sense amplifier activation circuit. Also, a variety of different sensing circuit designs can be used in place of sensing circuit 60.

Although the present invention has been described with reference to specific embodiments, further modifications and improvements will occur to those skilled in the art. Also, those skilled in the art can appreciate that variations in design and elements may still accomplish the functions of the present invention. Therefore, it is to be understood that the invention encompasses all such modifications that do not depart from the scope of the invention as defined in the appended claims, and equivalents thereof.

What is claimed is:

1. A memory device comprising:
   a memory array comprising a plurality of memory cells;
   a precharge circuit coupled to a selected bitline of the memory array and adapted to bias the selected bitline prior to selection of a wordline;
   a decoupling device coupled between the selected bitline and the precharge circuit and adapted to decouple the precharge circuit from the selected bitline; and
   a detecting circuit coupled to the decoupling device and the selected bitline, wherein the detecting circuit activates the decoupling device after a predetermined time.

2. The memory device as in claim 1, wherein the precharge circuit is adapted to receive a pulse signal; and wherein the precharge circuit is enabled on assertion of the pulse signal.

3. The memory device of claim 2, wherein:
   the detecting circuit comprises an inverter having an inverter input and an inverter output, wherein the inverter input is coupled to a first current electrode of the decoupling device and the inverter output is coupled to a control electrode of the decoupling device; and
   the detecting circuit detects when a voltage of the selected bitline is approximately above a predetermined voltage level associated with the inverter.

4. The memory device as in claim 3, wherein the inverter comprises at least one n-channel device; and
   wherein the predetermined voltage level is approximately equal to the transistor threshold voltage of the at least one n-channel device.

5. The memory device as in claim 4, further comprising:
   a sense amplifier coupled to the selected bitline; and
   a delay circuit coupled to the detecting circuit and to the sense amplifier, wherein the delay circuit delays activation of the sense amplifier.

6. The memory device as in claim 5, wherein the delay circuit comprises a plurality of inverters.

7. The memory device as in claim 2, wherein:
   the detecting circuit comprises a first transistor and a second transistor; and
   the detecting circuit detects when a voltage of the selected bitline is approximately above a predetermined voltage level associated with one of the first and second transistors.

8. The memory device of claim 7, wherein:
   a control electrode of the first transistor is coupled to a first current electrode of the decoupling device;
   a first current electrode of the first transistor is coupled to a control electrode of the decoupling device and a first current electrode of the second transistor; and
   a control electrode of the second transistor is coupled to the first current electrode of the decoupling device.

9. The memory device of claim 8, further comprising:
   a sense amplifier coupled to the selected bitline; and
   a delay circuit coupled to the first current electrode of the first transistor, wherein the delay circuit delays activation of the sense amplifier.

10. The memory device as in claim 1, further comprising:
    a bitline multiplexer coupled to the memory array, the bitline multiplexer coupled to a plurality of bitlines, the bitline multiplexer adapted to select a bitline from the plurality of bitlines;
    a sensing circuit coupled to the selected bitline;
    wherein in response to assertion of the pulse signal the precharge circuit is enabled, and in response to negation of the pulse signal the precharge circuit is disabled.

11. The memory device as in claim 10, wherein the detecting means detects when a voltage of the selected bitline is approximately above a predetermined voltage level.

12. The memory device as in claim 1, wherein the memory array is a nonvolatile memory.

13. A method for reading a nonvolatile memory cell in a memory array, comprising the steps:
    selecting a bitline corresponding to the nonvolatile memory cell;

charging the bitline with a precharge circuit and a pull-up circuit, wherein the precharge circuit is enabled by a first edge of a pulse signal;

disabling the precharge circuit by a second edge of the pulse signal;

selecting a wordline corresponding to the nonvolatile memory cell; and enabling a sense amplifier to read the bitline.

14. The method of claim 13, further comprising the steps of:

monitoring a voltage of the bitline;

isolating the precharge circuit from the bitline when the voltage of the bitline is approximately equal to a predetermined level.

15. The method of claim 14, wherein the step of isolating the precharge circuit is performed prior to the step of disabling the precharge circuit by the second edge of the pulse signal.

16. The method of claim 14, further comprising the step of:

sensing the bitline after a predetermined delay.

17. The method of claim 16, wherein the predetermined delay starts with the step of isolating the precharge circuit.

18. The method of claim 13, wherein:

the precharge circuit has a first pull-up rate and the pull-up circuit has a second pull-up rate; and the first pull-up rate is faster than the second pull-up rate.

19. The method of claim 13, wherein:

the first edge is a rising edge; and the second edge is a falling edge.

20. A memory device comprising:

a memory array comprising a plurality of memory cells;

a bitline multiplexer coupled to the memory array, the bitline multiplexer coupled to a plurality of bitlines, the bitline multiplexer adapted to select a bitline from the plurality of bitlines;

a pull-up device coupled to the selected bitline of the memory array;

a boost unit coupled to the selected bitline, wherein the boost unit is adapted to bias the selected bitline prior to selection of a wordline; and a sensing circuit coupled to the selected bitline;

wherein in response to assertion of a pulse signal, the boost unit is enabled, and in response to negation of the pulse signal the boost unit is disabled.

* * * * *